United States Patent
Peterson

(10) Patent No.: US 6,678,382 B2
(45) Date of Patent: *Jan. 13, 2004

(54) DIGITAL ATTENUATOR

(75) Inventor: Eric Carl Peterson, Nobelsville, IN (US)

(73) Assignee: Thomson Licensing S.A., Boulogne (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/978,356

(22) Filed: Nov. 25, 1997

(65) Prior Publication Data

US 2003/0161489 A1 Aug. 28, 2003

(51) Int. Cl.⁷ .............................. H03G 3/00; H04B 1/64
(52) U.S. Cl. ...................... 381/104; 381/107; 381/108; 333/14
(58) Field of Search ................................ 381/104–109, 381/58–59; 700/94; 333/14; 708/208; 84/600–604, 615, 625

(56) References Cited

U.S. PATENT DOCUMENTS

| 4,566,076 A | * | 1/1986 | van der Steen | 364/757 |
| 4,578,667 A | * | 3/1986 | Hollister | 340/347 |
| 4,719,833 A | * | 1/1988 | Katoh et al. | 84/603 |
| 4,953,437 A | * | 9/1990 | Starkey | 84/603 |
| RE33,739 E | * | 11/1991 | Takashima et al. | 84/603 |
| 5,570,091 A | * | 10/1996 | Noro et al. | 341/161 |
| 5,592,403 A | * | 1/1997 | Trager et al. | 364/724.01 |
| 5,764,775 A | * | 6/1998 | Kim | 381/1 |
| 6,088,461 A | * | 7/2000 | Lin et al. | 381/104 |
| 6,405,092 B1 | * | 6/2002 | Oxford | 381/104 |

* cited by examiner

Primary Examiner—Forester W. Isen
Assistant Examiner—Laura A. Grier
(74) Attorney, Agent, or Firm—Joseph S. Tripoli; Kuniyuki Akiyama

(57) ABSTRACT

Apparatus and a concomitant method for generating an approximation of a logarithmically attenuated value of a digital signal in predefined increments. Specifically, the apparatus comprises a shift register, a latch and an adder. The shift register selectively shifts the digital signal a first number of bits to the right to produce a first shifted signal and then a second number of bits to the right to produce a second shifted signal. The latch is connected to the shift register and latches the first shifted digital signal while the digital signal is being shifted to form the second shifted signal. The adder is connected to the shift register and the latch and adds the first shifted signal to the second shifted signal to produce the attenuated value of the input digital signal.

8 Claims, 3 Drawing Sheets

DIGITAL ATTENUATOR

BACKGROUND OF THE INVENTION

1. Field of the Invention

The invention relates generally to digital signal processing circuitry and, more specifically, to a signal amplitude control device that digitally attenuates a signal.

2. Description of the Background Art

Traditionally, audio products are manufactured with analog components. An input analog signal is received and passed through a series of analog filters, amplifiers and potentiometers to select and modify an output signal to the desired frequency, amplitude, and the like. A certain undesirable interference or noise level is inherent with such analog components. Additionally, many of these devices have linear characteristics which are useful in many applications, but not for volume control of an audio signal. The human ear has a substantially logarithmic sensitivity to variations in sound. Ideally, a volume control should logarithmically control sound level rather than linearly.

Advancements in digital signal processing circuitry have resulted in higher quality digital audio products. These devices contain large scale integrated circuit components which are more stable and have higher signal-to-noise ratios than their fully analog predecessors. Digital circuitry is especially useful for volume control (signal attenuation) since the noise from analog components is eliminated and precise manipulation of signals is possible. Specifically, digital signal processing requires that an input analog signal be converted into the digital domain e.g., a sequence of multi-bit digital samples representing the amplitude of the input analog signal. The digital signal is applied to a number of hardware components such as adders, subtractors, multipliers and dividers, digital filters, and the like to establish an attenuation multiplier which is applied to the existing signal to increase or decrease the amplitude of the signal. Lastly, the attenuated input signal is converted back into the analog domain to create the desired analog output signal. However, if too many multipliers (or dividers) are required to create the attenuated signal, an undesirable complex, costly, and slow circuit is created. As such, most digital volume control circuits rely on a simple discrete attenuation step of 6 dB. Such a discrete 6 dB step is implemented merely by shifting each multibit sample one bit to the right (i.e., a division by two). A higher degree of precision (e.g., 2 dB) is preferred, but is difficult to attain because of the excessive number of mathematical operations required to determine an appropriate attenuation multiplier. For example, a single 2 dB change corresponds to an attenuation multiplier of 0.794. For each successive 2 dB change, the multiplier is determined by multiplying powers of 0.794, i.e., 6 db change=3 steps=$0.794^3$=0.5006. The multiplier is used to scale the input sample to achieve the attenuation effect.

One solution to providing predefined 2 dB incremental attenuation is to use logarithm and antilogarithm tables stored in a Read Only Memory (ROM). The log table determines log values for the operands of a given multiplication (or division) operation. Consequently, the more complex operation is reduced to an addition (or subtraction) of the log values of the operands. The resultant log value is then identified in the antilog table to determine the product (or quotient) which becomes the attenuation multiplier. This method is limited in that a certain error (truncation error) is inherent in the log or antilog values. The error depends on the number of bits used to represent the log and antilog values. Reducing the error by using more bits to represent the values and produce larger tables containing more accurate log values generally exceeds design and cost constraints.

U.S. Pat. No. 4,004,140 of Izumi et al. teaches a digital attenuator capable of providing an output signal nearly in proportion to an input signal utilizing log compressed data as defined by the following equation; $P_{out}=\alpha P_{in}+N$ (see FIG. 4, linear curves "b", "c" and "e" plotted on a log—log scale and Column 2, lines 24–26). The Izumi et al. attenuator employs a calculator 5 comprised of two shift registers and an adder, a pattern generating circuit 6, a second adder 7 and a comparator 8.

As such, the state of the art is limited in that present volume control circuits can cost effectively attenuate a signal in a logarithmic manner using only 6 dB increments. If more precise attenuation increments are preferred, i.e., 2 dB, complex circuitry or memory consuming tables are necessary to complete the task without increasing error margins or processing time.

Therefore, there is a need in the art for an improved digital attenuator that provides a simple, cost effective design capable of logarithmically attenuating a signal using less than 6 dB increments.

SUMMARY OF THE INVENTION

The disadvantages heretofore associated with the prior art are overcome by an inventive digital attenuator which provides an approximation of a logarithmically attenuated value that is computationally simple to calculate and provides a logarithmic response in relatively small increments (e.g., 2 dB). The digital attenuator contains a shift register, an adder and a latch. The shift register shifts an incoming digital signal by n bits. The n-bit shifted signal is coupled to an input terminal of the latch. The incoming signal is then shifted a second time by m minus n bits (to provide a m-bit shifted signal) and coupled to one input terminal of the adder. The values of n and m are integer values predefined by a system within which the digital attenuator is intended to operate and may be stored in a lookup table or computed via combinational logic. The values control the level of attenuation and are selected from the lookup table or decoded as appropriate, according to a position sensor or logic decoder coupled to a control device such as a volume control knob or button(s). The adder calculates the approximate attenuated value by adding the n and m bit shifted signals.

Additionally, the invention includes a method of approximating a logarithmically attenuated value for attenuating a digitized signal having the steps of coupling the digitized input signal to a shift register, shifting the digitized input signal a first time and coupling the first-shifted signal to a latch, shifting the digitized input signal a second time and coupling the second-shifted signal to an adder, coupling the latched, first-shifted signal to the adder and adding the first-shifted and second-shifted signals to produce the logarithmically attenuated value.

This invention fulfills the long felt need for a signal amplitude control circuit, e.g., a volume control circuit for an audio signal, that attenuates a signal in increments that are less than 6 dB (e.g., 2 dB increments). In particular, the n and m shifted digital signals represent the original analog signal that has been, as appropriate, repeatedly divided by 2. By adding the two fractions, a scaled value that reasonably approximates a true logarithmically attenuated value is created.

BRIEF DESCRIPTION OF THE DRAWINGS

The teachings of the present invention can be readily understood by considering the following detailed description in conjunction with the accompanying drawings, in which.

Figure 1:
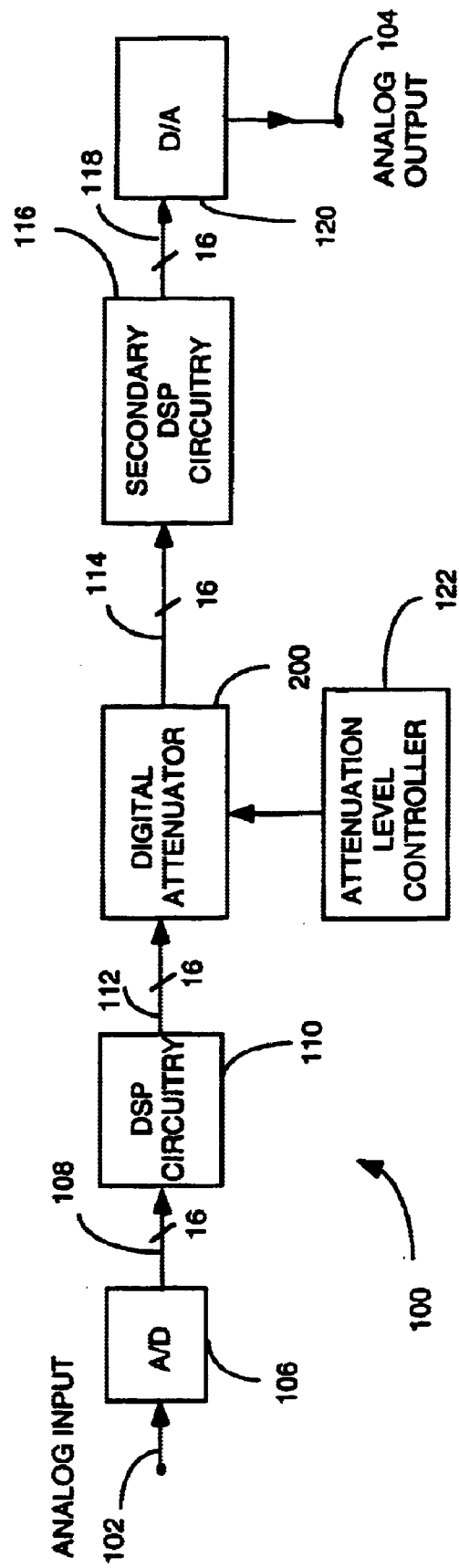
FIG. 1 depicts a block diagram of a digital signal processing system containing a digital attenuator in accordance with the invention.

Table I depicts the actual attenuation and error with respect to the ideal attenuation of an embodiment in accordance with this invention.

To facilitate understanding, identical reference numerals have been used, where possible, to designate identical elements that are common to the figures.

DETAILED DESCRIPTION

FIG. 1 depicts a block diagram of a digital signal processing system 100 including a digital attenuator 200 of the present invention. The system 100 contains the basic components necessary to receive and select a desired analog signal, process the signal digitally according to predefined and customized system user parameters and provide a desired output analog signal. For example, the input signal could be a standard commercial broadcast frequency modulated (FM) carrier wave in the 88–108 MHz band. The output analog signal derived from the carrier wave input signal is a low-level AC signal for driving an amplifier and speakers in a home theater audio system. Specifically, the system 100 receives, on port 102, an analog input signal. The system 100 contains an analog-to-digital (A/D) converter 106, digital signal processing (DSP) circuitry 110, a digital attenuator 200, an attenuation level controller 122, secondary DSP circuitry 116 and a digital-to-analog (D/A) converter 120.

The A/D converter 106 converts the analog input signal into a digital signal (on path 108) containing a sequence of multi-bit digital samples representing the amplitude of the input signal. After conversion, the digital signal processing circuitry 110, conventionally processes the digital signal, i.e., amplifying, filtering, demodulating and the like. The signal on path 112 (e.g., an audio signal) is then processed by the digital attenuator 200 to calculate a desired scaled value. The scaled value approximates the attenuated signal value that would otherwise be generated by conventional attenuation methods. The level of attenuation is governed by an output value from the attenuation level controller 122, e.g., a volume control switch. The digital attenuator 200 processes the unattenuated digital signal from path 112 using the output value from the attenuation level controller 122 yielding the desired attenuated signal. The attenuated signal on path 114 is coupled to the secondary DSP circuitry 116. The secondary digital signal processing circuitry 116, i.e., amplifiers or equalizers, condition the attenuated signal for output. The D/A converter 120 converts the signal on path 118 into an analog signal thereby creating an analog output at output terminal 104. The system 100 is generally capable of manipulating 16-bit samples of the analog signal. If necessary, the system components and connecting hardware can be designed to accommodate other size samples, i.e., 32 or 64 bits, for use with more powerful and higher speed applications.

Figure 2:
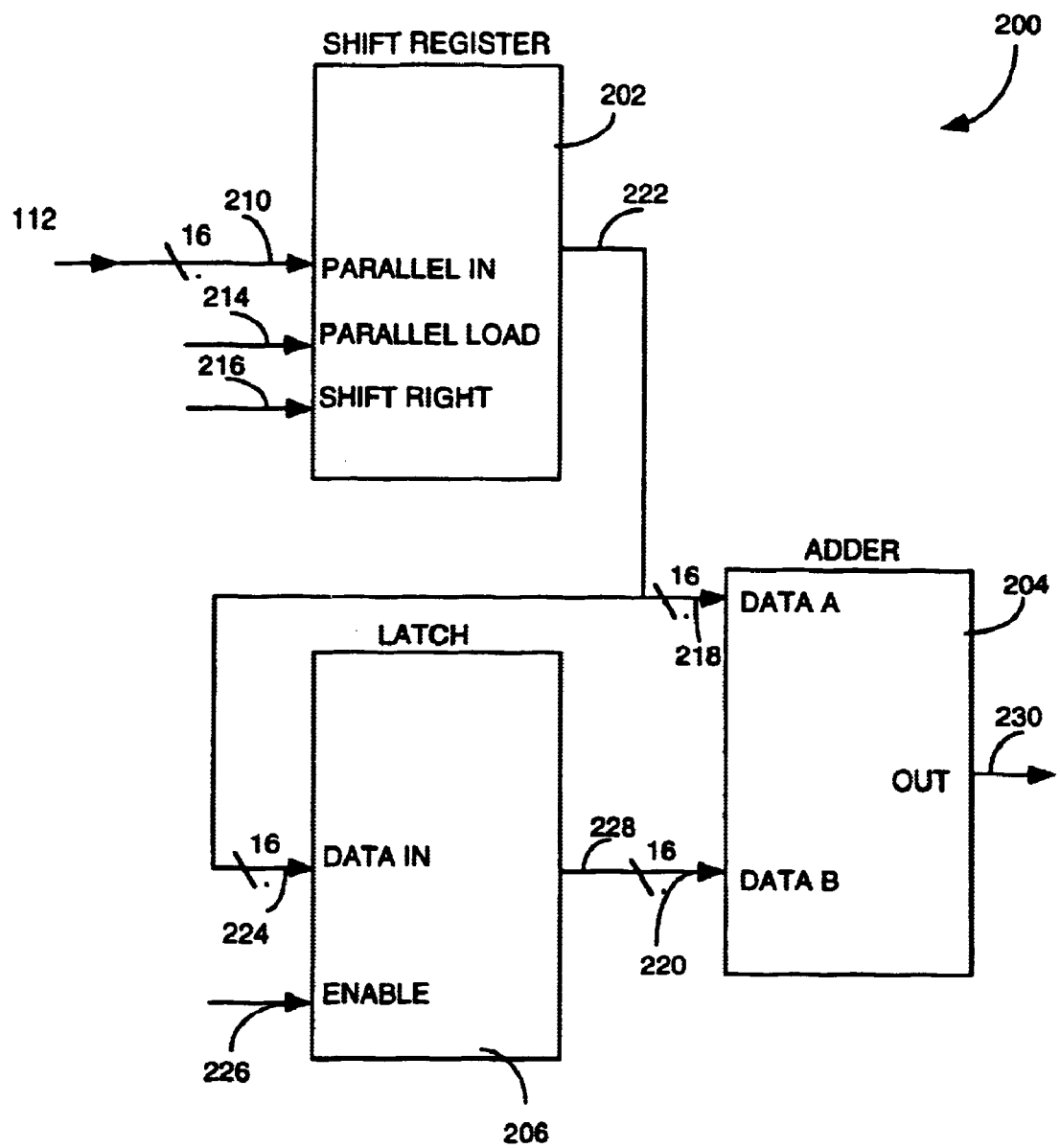
FIG. 2 depicts a detailed schematic diagram of the inventive digital attenuator of FIG. 1.

FIG. 2 depicts a schematic diagram of the digital attenuator 200. The digital attenuator 200 contains a shift register 202, an adder 204 and a latch 206. The shift register 202 has a parallel data input terminal 210 to accept a parallel 16-bit input signal via path 112 and a parallel load (terminal 214) thereby permitting the shift register to be "broadside loaded". The shift register 202 is has a shift right (terminal 216) for shifting the loaded input signal. Further, the shift register 202 may also have an input terminal for serial data (not shown). The adder 204 has a DATA A input terminal 218 and the latch 206 has a DATA IN terminal 224 which are both connected to the output terminal 222 of the shift register 202. Additionally, the latch 206 has an ENABLE control signal input terminal 226. When the appropriate control signal is applied to the ENABLE input terminal 226 of the latch 206, the 16-bit parallel signal is applied to a DATA B input terminal 220 of the adder 204 via latch output terminal 228. The adder output terminal 230 provides the above mentioned attenuated value to the secondary DSP circuitry 116. The digital attenuator 200 is capable of performing the required number of digital bit shift and add operations necessary to create an attenuated value that approximates a desired 2 dB increment in signal attenuation. In the preferred embodiment, adder 204 is continuously enabled and thus the output value provided on OUT terminal 230 will change as inputs change. Therefore, transitional data will be present on OUT terminal 230 during operation. For example, the "last" latched value from the last sample will be added with different shifted versions of the new sample prior to it's being latched in the latch (i.e., the n-bit shifted value). This n-bit shifted value is added to successive shiftings of the value until the "m" bit shifting has occurred. Finally, the proper output value stabilizes at the output, the "settling time" consists of the "n" bit shift times, plus the "m" bit shift time, plus the add time of the adder 204. Optionally, an "output valid" signal could be provided asynchronously, or the machine could be constructed not to use the attenuated value until data is known to be correct and settled. Thus, this attenuated value may be viewed as the result of a theoretical multiplication of an attenuation multiplier C and the amplitude A of the digitized input signal. This attenuation multiplier is calculated in the digital domain according to the following equation:

$$C = (2^{-n}) + (2^{-m}) \tag{1}$$

where n and m are operator controllable values of n=0, 1, 2 . . . and m=0, 1, 2 . . . for 2 dB increments. Other values of n and m provide larger increments.

The position of the attenuation level controller 122 (i.e., a volume control knob or other control device) corresponds to a specific value for n and m. These values can be assigned in a lookup table, derived by a logic decoder or other simple method. The values selected for n and m correspond to the number of bit shifts and adds that occur in the digital attenuator 200. The shifts and add operations derive the attenuation multiplier and apply the multiplier to the original amplitude A. For example, a 2 dB increment corresponds to n=1 and m=2. Solving for C in equation (1):

$$C = (1/2) + (1/4)$$

$$C = 0.75.$$

Therefore, to reduce the existing volume 2 dB (at amplitude level A) the multiplier 0.75 is theoretically multiplied by the digital input value on line 112.

Figure 3:
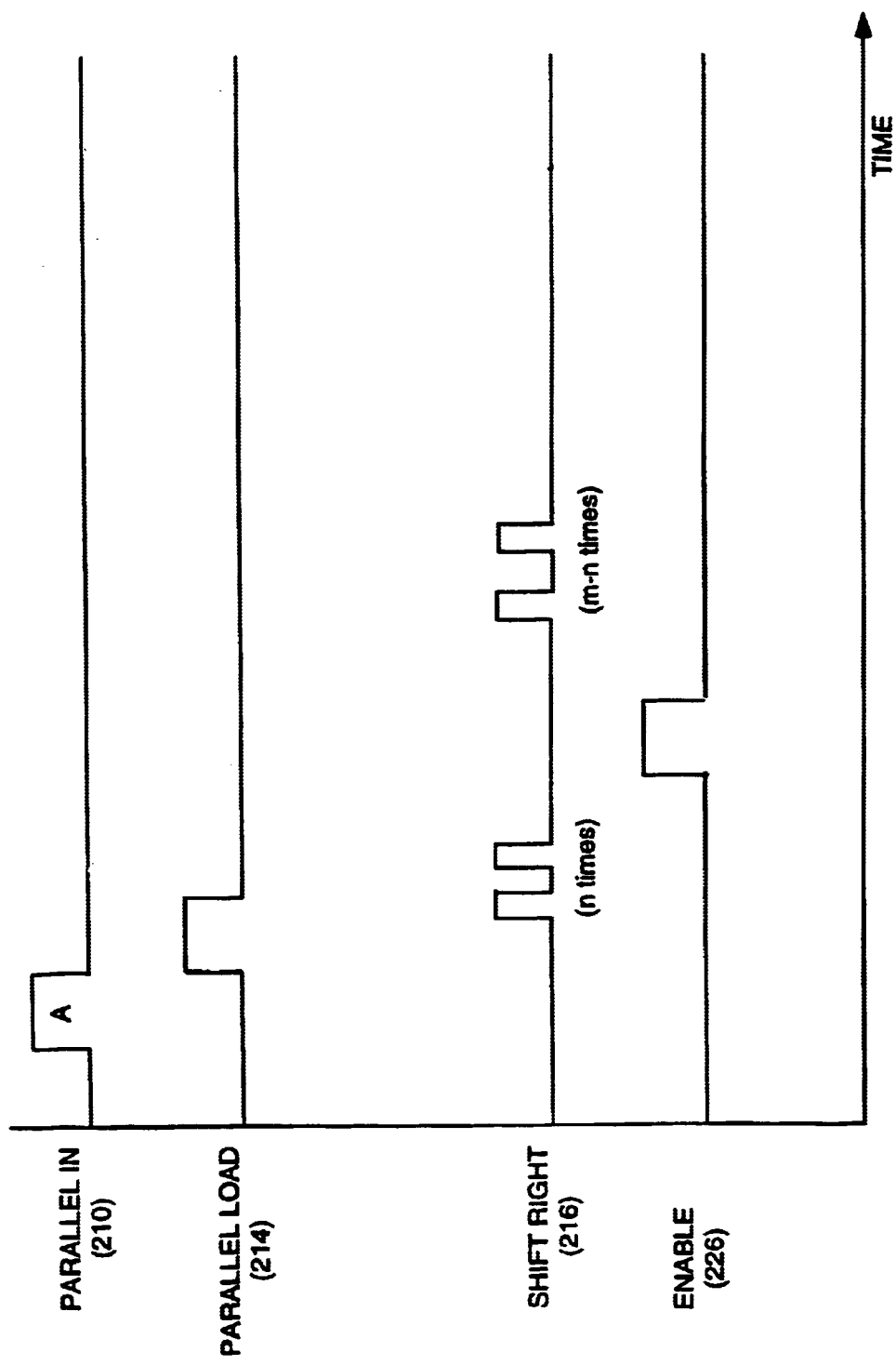
FIG. 3 depicts a timing diagram for the digital attenuator.

FIG. 3 depicts an exemplary timing diagram for the shift sequence used by the digital attenuator 200. To best understand the operation of the invention, the reader should simultaneously refer to FIGS. 2 and 3.

In operation, n controls the number of bit shifts to the first addend $2^{-n}$ and m controls the number of shifts to the second addend $2^{-m}$. The 16-bit amplitude signal A is provided at the input terminal 210 of the shift register 202. A series of "n" clock pulses is produced by either a processor or a state machine and is provided serially to the shift right input terminal 216. The shift register 202 shifts the 16-bit amplitude signal A, n bits to the right by loading in "leading zeroes". Shifting a binary word n bits to the right is equivalent to dividing the binary word by $2^n$. The n-shifted bit pattern is coupled to the DATA IN terminal 224 of latch 206 and is temporarily stored in latch 206 in response to a control signal provided to enable terminal 226. This presents the n-bit shifted signal to adder 204 until a new shifted signal is stored in latch 206 as described above.

Next, a series of "m−n" clock pulses is produced by either a processor or a state machine and is provided serially to the shift right input terminal 216. The shifter shifts the previously n bit shifted 16-bit amplitude signal A to the right (m-n) times to provide a m-bit shifted amplitude signal A. This operation is equivalent to dividing A by $2^m$. The (m-n) shifted bit pattern is coupled to the DATA A terminal 218 of the adder 204 and is provided to the DATA IN terminal 224 of latch 206. (However, the m-bit shifted amplitude signal A is not loaded into latch 206.) The n and m shifted bit patterns provided on terminals 218 and 220 of adder 204 are then added to each other to create the desired output value. This output value approximates the actual value that would have been calculated if a true logarithmic function was executed.

For example, it has been previously discussed that a number x of 2 dB increments corresponds to a multiplier of $0.794^x$. Therefore, a 4 dB increment dictates x=2 and $0.794^2=0.630$. For a 4 dB increment, n=1 and m=3 according to one of the predefined tables or logic operators discussed above. Solving equation (1), C=0.625 which is a reasonable approximation to the expected value 0.630. Table 1 shows experimental data for the ideal attenuation level (in 2 dB increments) including the approximate multiplier calculated by the inventive digital attenuator, the actual attenuation level, and error between the ideal and actual attenuation levels. As can be seen from this table, the invention is capable of generating attenuation levels in 2 dB increments that are within a reasonable error range. However, this circuit employs none of the hardware required to execute a hard multiply, calculate log and antilog values or search a look up table to find equivalent log and antilog values. The simplicity of the circuit facilitates easy manufacturing and debugging. Additionally, processing time is faster than a more complex multiplier circuit.

The digital attenuator of the present invention finds particular use as a volume control for audio signal processing circuits in the television and radio arts. However, the digital attenuator can be used to attenuate a digital representation of any signal including audio, video, and the like.

Although various embodiments which incorporate the teachings of the present invention have been shown and described in detail herein, those skilled in the art can readily devise many other varied embodiments that still incorporate these teachings.

TABLE I

| Ideal dB atten. | Ideal Multiplier | Shift Coefficients | | | Actual Multiplier | Actual dB atten | Error (dB) |
| --- | --- | --- | --- | --- | --- | --- | --- |
| | | n | m | m-n | | | |
| 0 | 1.000000 | 0 | 16 | 16 | 1.0000 | 0 | 0.00 |
| −2 | 0.794328 | 1 | 2 | 1 | 0.7500 | −2.498775 | 0.50 |
| −4 | 0.630957 | 1 | 3 | 2 | 0.6250 | −4.0824 | 0.08 |
| −6 | 0.501187 | 1 | 16 | 15 | 0.5000 | −6.0206 | 0.02 |
| −8 | 0.398107 | 2 | 3 | 1 | 0.3750 | −8.519375 | 0.52 |
| −10 | 0.316228 | 2 | 4 | 2 | 0.3125 | −10.103 | 0.10 |
| −12 | 0.251189 | 2 | 16 | 14 | 0.2500 | −12.0412 | 0.04 |
| −14 | 0.199526 | 3 | 4 | 1 | 0.1875 | −14.53997 | 0.54 |
| −16 | 0.158489 | 3 | 5 | 2 | 0.1563 | −16.1236 | 0.12 |
| −18 | 0.125893 | 3 | 16 | 13 | 0.1250 | −18.0618 | 0.06 |
| −20 | 0.100000 | 4 | 5 | 1 | 0.0938 | −20.56057 | 0.56 |
| −22 | 0.079433 | 4 | 6 | 2 | 0.0781 | −22.1442 | 0.14 |
| −24 | 0.063096 | 4 | 16 | 12 | 0.0625 | −21.0824 | 0.08 |
| −26 | 0.050119 | 5 | 6 | 1 | 0.0469 | −26.58117 | 0.58 |
| −28 | 0.039811 | 5 | 7 | 2 | 0.0391 | −28.1648 | 0.16 |
| −30 | 0.031623 | 5 | 16 | 11 | 0.0313 | −30.103 | 0.10 |
| −32 | 0.025119 | 6 | 7 | 1 | 0.0234 | −32.60177 | 0.60 |
| −34 | 0.019953 | 6 | 8 | 2 | 0.0195 | −34.1854 | 0.19 |
| −36 | 0.015849 | 6 | 16 | 10 | 0.0156 | −36.1236 | 0.12 |
| −38 | 0.012589 | 7 | 8 | 1 | 0.0117 | −38.62237 | 0.62 |
| −40 | 0.010000 | 7 | 9 | 2 | 0.0098 | −40.206 | 0.21 |
| −42 | 0.007943 | 7 | 16 | 9 | 0.0078 | −42.1442 | 0.14 |
| −44 | 0.006310 | 8 | 9 | 1 | 0.0059 | −44.64297 | 0.64 |
| −46 | 0.005012 | 8 | 10 | 2 | 0.0049 | −46.2266 | 0.23 |
| −48 | 0.003981 | 8 | 16 | 8 | 0.0039 | −48.1648 | 0.16 |
| −50 | 0.003162 | 9 | 10 | 1 | 0.0029 | −50.66357 | 0.66 |
| −52 | 0.002512 | 9 | 11 | 2 | 0.0024 | −52.2472 | 0.25 |
| −54 | 0.001995 | 9 | 16 | 7 | 0.0020 | −54.1854 | 0.19 |
| −56 | 0.001585 | 10 | 11 | 1 | 0.0015 | −56.68417 | 0.68 |
| −58 | 0.001259 | 10 | 12 | 2 | 0.0012 | −58.2678 | 0.27 |
| −60 | 0.001000 | 10 | 16 | 6 | 0.0010 | −60.206 | 0.21 |

What is claimed is:

1. Apparatus for generating approximate logarithmic attenuated values for a digital signal comprising:

a shift register for selectively shifting said digital signal a first number of bits to the right to produce a first shifted signal and a second number of bits to the right to produce a second shifted signal;

a latch having an input connected to an output of said shift register for latching said first shifted digital signal to produce a latched signal; and an adder having a first input connected to said output of said shift register and a second input connected to an output of said latch for adding said latched signal to said second shifted signal to produce said approximate logarithmic attenuated values.

2. The apparatus of claim 1 wherein said first shifted signal is shifted a second number of bits to the right to produce said second shifted signal.

3. The apparatus of claim 2 wherein said first number of bits is determined by an attenuation level controller connected to said shift register.

4. The apparatus of claim 3 wherein said second number of bits is determined by an attenuation level controller connected to said shift register.

5. The apparatus of claim 1 wherein said first number of bits is determined by an attenuation level controller connected to said shift register.

6. The apparatus of claim 5 wherein said second number of bits is determined by an attenuation level controller connected to said shift register.

7. A method of generating approximate logarithmically attenuated values of a digital signal comprising the steps of:

providing said digital signal to a shift register;

shifting said digital signal a first number of bits to produce a first shifted signal and coupling said first shifted signal to a latch to produce a latched signal;

shifting said digital signal a second number of bits to produce a second shifted signal and coupling said second shifted signal to an adder;

coupling said latched signal from said latch to said adder; and adding said latched signal and said second shifted signal to produce said approximate logarithmically attenuated values.

8. The method of claim 7 wherein said first and second number of bits are determined by an attenuation level controller connected to said shift register.

* * * * *